United States Patent
Hu et al.

(10) Patent No.: US 12,429,508 B1
(45) Date of Patent: Sep. 30, 2025

(54) IMPEDANCE MEASUREMENT METHOD AND APPARATUS FOR CONVERTER, ELECTRONIC DEVICE, AND MEDIUM

(71) Applicant: ZHEJIANG UNIVERSITY, Hangzhou (CN)

(72) Inventors: Pengfei Hu, Hangzhou (CN); Quansen Rong, Hangzhou (CN); Yanxue Yu, Hangzhou (CN); Dong Wang, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 19/026,502

(22) Filed: Jan. 17, 2025

(30) Foreign Application Priority Data

Apr. 2, 2024 (CN) .......................... 202410396063.7

(51) Int. Cl.
*G01R 27/16* (2006.01)
*H02M 7/5387* (2007.01)

(52) U.S. Cl.
CPC ........ *G01R 27/16* (2013.01); *H02M 7/53871* (2013.01)

(58) Field of Classification Search
CPC ........ G01R 27/16; G01R 27/02; G01R 27/08; H02M 7/53871
See application file for complete search history.

(56) References Cited

U.S. PATENT DOCUMENTS

| | | |
|---|---|---|
| 2013/0099800 A1 | 4/2013 | Francis et al. |
| 2014/0043039 A1 | 2/2014 | Kusumoto et al. |
| 2020/0225291 A1 | 7/2020 | Hinterberger et al. |

FOREIGN PATENT DOCUMENTS

| | | | | |
|---|---|---|---|---|
| CN | 108509697 A | * | 9/2018 | ............. G06F 30/33 |
| CN | 112737322 A | * | 4/2021 | |

(Continued)

OTHER PUBLICATIONS

Meng Zhiquan, et al., Generalized-impedance Measurement for Grid-connected Converters Based on Perturbation in Control System, Proceedings of the CSEE, 2018, pp. 5381-5391, vol. 38 No. 18.

(Continued)

*Primary Examiner* — Catherine T. Rastovski
*Assistant Examiner* — Yossef Korang-Beheshti
(74) *Attorney, Agent, or Firm* — Bayramoglu Law Offices LLC

(57) ABSTRACT

An impedance measurement method and apparatus for a converter, an electronic device, and a medium are applied to the field of converter data calculation and processing. A positive-sequence current disturbance and a positive-sequence voltage disturbance are respectively superimposed at a current value sampling position and a voltage value sampling position of the converter, to obtain a first disturbance current value, a first disturbance voltage value, a second disturbance current value, and a second disturbance voltage value; a first to-be-measured impedance value and a transfer function are determined based on the obtained values; further, a second to-be-measured impedance value and an initial impedance value are determined based on the first to-be-measured impedance value, the transfer function, a filter equivalent impedance value, and relevant parameters of the converter, and a final target impedance value of the converter is determined based on the initial impedance value and a decoupling coefficient.

1 Claim, 9 Drawing Sheets

(56) References Cited

FOREIGN PATENT DOCUMENTS

| | | | |
|---|---|---|---|
| CN | 112952898 A | | 6/2021 |
| CN | 113746129 A | * | 12/2021 |
| CN | 114325113 A | * | 4/2022 |
| CN | 114384327 A | | 4/2022 |
| CN | 114935690 A | | 8/2022 |
| CN | 114935692 A | | 8/2022 |
| CN | 116298520 A | | 6/2023 |
| CN | 117277350 A | | 12/2023 |
| JP | 2007132665 A | | 5/2007 |
| WO | 2024045569 A1 | | 3/2024 |

OTHER PUBLICATIONS

Wang Yandong, Study and Discussion on Electric Power System Harmonic Impedance Characterizes and Its Measurement Method, Journal of Electrical Engineering, 2004, pp. 64-67, Issue 3.

Zhong Peijun, et al., Measurement Method of Inverter Output Impedance Based on Voltage Disturbance Source, Transactions of China Electrotechnical Society, 2019, pp. 4739-4750, vol. 34 No. 22.

* cited by examiner

IMPEDANCE MEASUREMENT METHOD AND APPARATUS FOR CONVERTER, ELECTRONIC DEVICE, AND MEDIUM

CROSS-REFERENCE TO THE RELATED APPLICATIONS

This application is based upon and claims priority to Chinese Patent Application No. 202410396063.7, filed on Apr. 2, 2024, the entire contents of which are incorporated herein by reference.

TECHNICAL FIELD

The present application relates to the field of converter data calculation and processing, and in particular, to an impedance measurement method and apparatus for a converter, an electronic device, and a medium.

BACKGROUND

A converter, as an electrical device capable of changing the voltage, frequency, phase, and other electrical quantities or characteristics of a power supply system, is widely applied in practical scenarios. During operation, the impedance value of the converter, as an important parameter, affects the quality of voltage stability. Based on the known specific structure and relevant parameters of the converter, the impedance value of the converter can be obtained according to a theoretical model of the positive-sequence impedance on the alternating current (AC) side of the converter. However, the specific structure and relevant parameters of the converter are often unknown, and thus, the impedance value of the converter needs to be measured practically.

There are two types of practical measurement methods: one is primary-side measurement method, and the other is secondary-side measurement method. The primary-side measurement method for the converter is specifically as follows: A disturbance voltage source is connected in series or a disturbance current source is connected in parallel at the port of the converter to be measured, and the broadband impedance characteristics of the port are calculated based on an output current and voltage at the port of the converter to be measured, as shown in FIG. 1. This method is the most commonly used method with higher accuracy. However, in practical engineering, this method has high costs, transportation difficulties, and complex operations when connecting the disturbance power source to the actual primary-side main circuit. Additionally, the disturbance source on the primary side has a slow disturbance switching speed, resulting in large time intervals between different frequency points. The disturbance source capacity also varies with different converter capacities, requiring the design of corresponding main circuits, control parameters, and protection apparatuses, making the universality of this method relatively poor. The secondary-side measurement method for the converter is specifically as follows: Impedance measurement of the converter is performed by injecting disturbances into the control loop of the converter. Currently, some existing disturbance injection methods include: A sine wave with a specific disturbance frequency is superimposed at voltage and current sampling points of a point of common coupling (PCC) of the converter, and the grid equivalent impedance in the main circuit needs to be artificially changed, that is, a small inductor is connected in series, before the measurement. Alternatively, disturbances can be injected at two locations: a reference voltage generation point of the converter and a phase-locked loop sampling voltage output point. The impedance value of the converter is finally obtained through calculation. However, the prerequisite for using this method is that the impedance measurement personnel know the basic control structure of the converter and need to modify a control loop in a controller of the converter to implement disturbance injection. Otherwise, this method fails. Furthermore, in this method, the control loops (feedforward loop and phase-locked loop) are measured independently, and the impact of the grid impedance is not considered, which is a flaw of this method.

In view of the above technology, finding an impedance measurement method for a converter is a problem urgently needing to be resolved by those skilled in the art.

SUMMARY

The purpose of the present application is to provide an impedance measurement method and apparatus for a converter, an electronic device, and a medium. The present application can address the issues in the prior art, such as the high costs, transportation difficulties, and complex operations in the primary-side measurement method, as well as the need for manufacturers to disclose the full design of the controller and the lack of consideration for grid impedance in secondary-side measurements.

In order to resolve the above technical problem, the present application provides an impedance measurement method for a converter, including:

superimposing a positive-sequence current disturbance at a current value sampling position of the converter, to obtain a first disturbance current value and a first disturbance voltage value;

superimposing a positive-sequence voltage disturbance at a voltage value sampling position of the converter, to obtain a second disturbance current value and a second disturbance voltage value;

determining a first to-be-measured impedance value and a transfer function based on the first disturbance current value, the first disturbance voltage value, the second disturbance current value, and the second disturbance voltage value;

determining a second to-be-measured impedance value based on the transfer function, a filter equivalent impedance value affected by a coupled grid impedance, and relevant parameters of the converter, where the relevant parameters of the converter include an inductance value, a capacitance value, and a frequency-domain operator;

determining an initial impedance value based on the first to-be-measured impedance value and the second to-be-measured impedance value;

determining a decoupling coefficient based on the transfer function and a filter equivalent impedance value under impact of a grid impedance at a secondary disturbance frequency; and determining a target impedance value of the converter based on the decoupling coefficient and the initial impedance value.

Preferably, an expression of the first disturbance current value is:

$$i_{g1} = \frac{v_{p1}}{Z_1'(s)} + \Delta i_t \times G_c;$$

where $i_{g1}$ is the first disturbance current value, $v_{p1}$ is the first disturbance voltage value generated by superimposing the positive-sequence current disturbance at the current value sampling position of the converter, $Z'_1(s)$ is the first to-be-measured impedance value, $\Delta i_t$ is a virtual injected disturbance current corresponding to the positive-sequence current disturbance superimposed at the current value sampling position of the converter, and $G_c$ is the transfer function.

Preferably, an expression of the second disturbance current value is:

$$i_{g2} = \frac{v_{p2} + \Delta v_t}{Z'_1(s)};$$

where $i_{g2}$ is the second disturbance current value, $v_{p2}$ is the second disturbance voltage value generated by superimposing the positive-sequence voltage disturbance at the voltage value sampling position of the converter, $Z'_1(s)$ is the first to-be-measured impedance value, and $\Delta v_t$ is a virtual disturbance voltage corresponding to the positive-sequence voltage disturbance superimposed at the voltage value sampling position of the converter.

Preferably, an expression of the second to-be-measured impedance value is:

$$Z'_0(s) = \frac{Z'_{filter}}{(1+G_c)\left(1 + \frac{L_1 C_f s^2}{C_f R_d s + 1}\right)};$$

where $Z'_0(s)$ is the second to-be-measured impedance value, $Z'_{filter}$ is the filter equivalent impedance value affected by the coupled grid impedance, $G_c$ is the transfer function, $L_1$ is the inductance value, $C_f$ is the capacitance value, and $s$ is the frequency-domain operator.

Preferably, an expression of the initial impedance value is:

$$\frac{1}{Z'_p(s)} = \frac{1}{Z'_0(s)} + \frac{1}{-Z'_1(s)};$$

where $Z'_1(s)$ is the first to-be-measured impedance value, $Z'_0(s)$ is the second to-be-measured impedance value, and $Z'_p(s)$ is the initial impedance value.

Preferably, the decoupling coefficient is determined based on the transfer function and the filter equivalent impedance value under impact of the grid impedance at the secondary disturbance frequency, where an expression of the decoupling coefficient is:

$$K' = \frac{Z_{filter} - \frac{G_c}{1+G_c} Z'_{filter}}{Z'_{filter} - \frac{G_c}{1+G_c} Z'_{filter}};$$

where K' is the decoupling coefficient, $Z'_{filter}$ is the filter equivalent impedance value affected by the coupled grid impedance, $Z_{filter}$ is a filter equivalent impedance value not affected by the coupled grid impedance, and $G_c$ is the transfer function; and $Z_{filter}$ is the filter equivalent impedance values and $Z'_{filter}$ is the filter equivalent impedance values with impact of the grid impedance at the secondary disturbance frequency; and the target impedance value of the converter is determined based on the decoupling coefficient and the initial impedance value, where an expression of the target impedance value is:

$$Z_p(s) = K' Z'_p(s);$$

where $Z'_p(s)$ is the initial impedance value, and $Z_p(s)$ is the target impedance value.

In order to resolve the above technical problem, the present application further provides an impedance measurement apparatus for a converter, including:

a current disturbance module configured to superimpose a positive-sequence current disturbance at a current value sampling position of the converter, to obtain a first disturbance current value and a first disturbance voltage value;

a voltage disturbance module configured to superimpose a positive-sequence voltage disturbance at a voltage value sampling position of the converter, to obtain a second disturbance current value and a second disturbance voltage value;

a first determining module configured to determine a first to-be-measured impedance value and a transfer function based on the first disturbance current value, the first disturbance voltage value, the second disturbance current value, and the second disturbance voltage value;

a second determining module configured to determine a second to-be-measured impedance value based on the transfer function, a filter equivalent impedance value affected by a coupled grid impedance, and relevant parameters of the converter, where the relevant parameters of the converter include an inductance value, a capacitance value, and a frequency-domain operator;

a third determining module configured to determine an initial impedance value based on the first to-be-measured impedance value and the second to-be-measured impedance value;

a fourth determining module configured to determine a decoupling coefficient based on the transfer function and a filter equivalent impedance value under impact of a grid impedance at a secondary disturbance frequency; and a fifth determining module configured to determine a target impedance value of the converter based on the decoupling coefficient and the initial impedance value.

In order to resolve the above technical problem, the present application further provides an electronic device, including a memory configured to store a computer program; and a processor configured to execute the computer program to implement steps of the above impedance measurement method for a converter.

In order to resolve the above technical problem, the present application further provides a computer-readable storage medium. The computer-readable storage medium stores a computer program, and the computer program, when executed by a processor, implements steps of the above impedance measurement method for a converter.

The impedance measurement method for a converter provided in the present application includes: superimposing a positive-sequence current disturbance at a current value sampling position of the converter, to obtain a first disturbance current value and a first disturbance voltage value; superimposing a positive-sequence voltage disturbance at a voltage value sampling position of the converter, to obtain a second disturbance current value and a second disturbance voltage value; determining a first to-be-measured impedance value and a transfer function based on the first disturbance current value, the first disturbance voltage value, the second disturbance current value, and the second disturbance voltage value; determining a second to-be-measured impedance value based on the transfer function, a filter equivalent impedance value affected by a coupled grid impedance, and relevant parameters of the converter, where the relevant parameters of the converter include an inductance value, a capacitance value, and a frequency-domain operator; determining an initial impedance value based on the first to-be-measured impedance value and the second to-be-measured impedance value; determining a decoupling coefficient based on the transfer function and a filter equivalent impedance value under impact of a grid impedance at a secondary disturbance frequency; and determining a target impedance value of the converter based on the decoupling coefficient and the initial impedance value. As can be seen, the present application injects virtual secondary-side disturbances at the voltage and current sampling points of the converter, specifically by superimposing the positive-sequence current disturbance and the positive-sequence voltage disturbance. During operation, there is no need to add actual disturbance sources or modify the primary-side circuit components. Overall, this results in low engineering costs and simple practical operation. In addition, calculation of the target impedance value in the present application does not require the converter manufacturers to disclose the parameters or structure of the controller, thereby expanding the application scope of the present application. Furthermore, during calculation of the target impedance value, the present application takes into account the impact of the grid impedance value and the line impedance value. Before obtaining the final target impedance value, decoupling is performed to remove the impact of the grid equivalent impedance, thereby obtaining the true and accurate impedance value of the converter.

BRIEF DESCRIPTION OF THE DRAWINGS

To describe the embodiments of the present application more clearly, the drawings required for describing the embodiments are briefly described below. Apparently, the drawings in the following description show merely some embodiments of the present application, and those of ordinary skill in the art may still derive other drawings from these drawings without creative efforts.

DETAILED DESCRIPTION OF THE EMBODIMENTS

The technical solutions in the embodiments of the present application are clearly and completely described below with reference to the accompanying drawings in the embodiments of the present application. Apparently, the described embodiments are merely some rather than all of the embodiments of the present application. All other embodiments obtained by those of ordinary skill in the art based on the embodiments of the present application without creative efforts should fall within the protection scope of the present application.

The core of the present application is to provide an impedance measurement method and apparatus for a converter, an electronic device, and a medium.

In order to make those skilled in the art better understand the solutions of the present application, the present application is further described in detail below with reference to the accompanying drawings and specific implementations.

Figure 1:
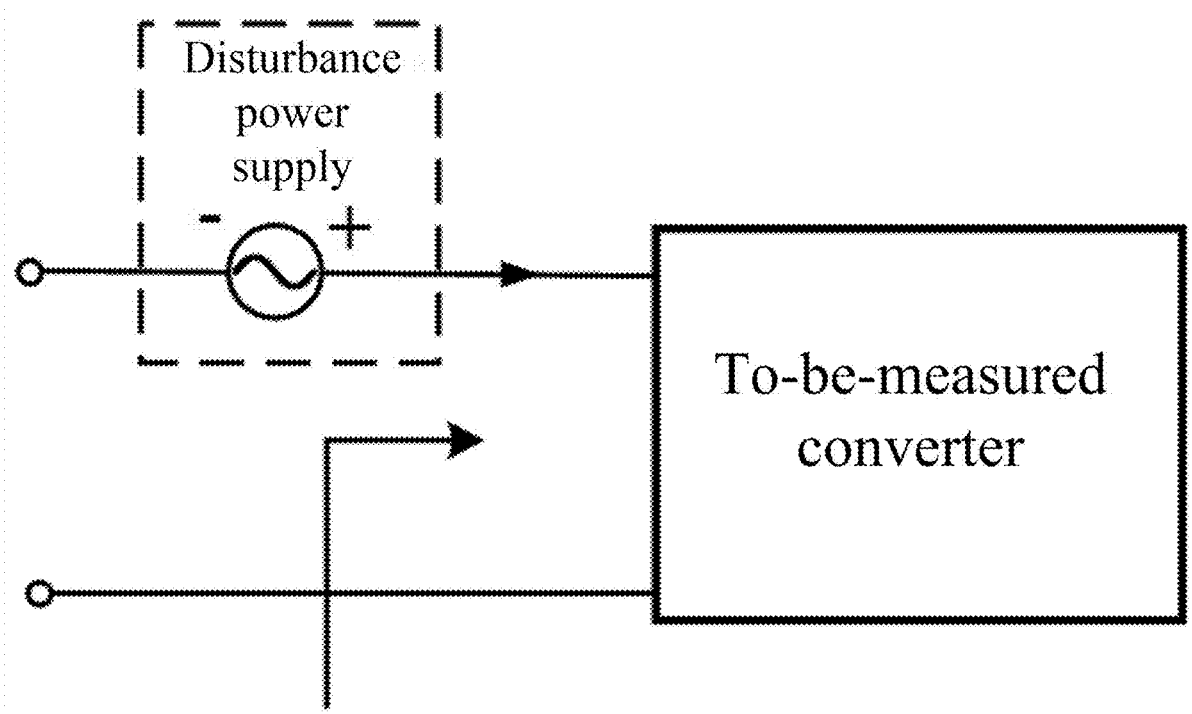
FIG. 1 is a schematic diagram of a primary-side measurement method in the prior art.
Figure 2:
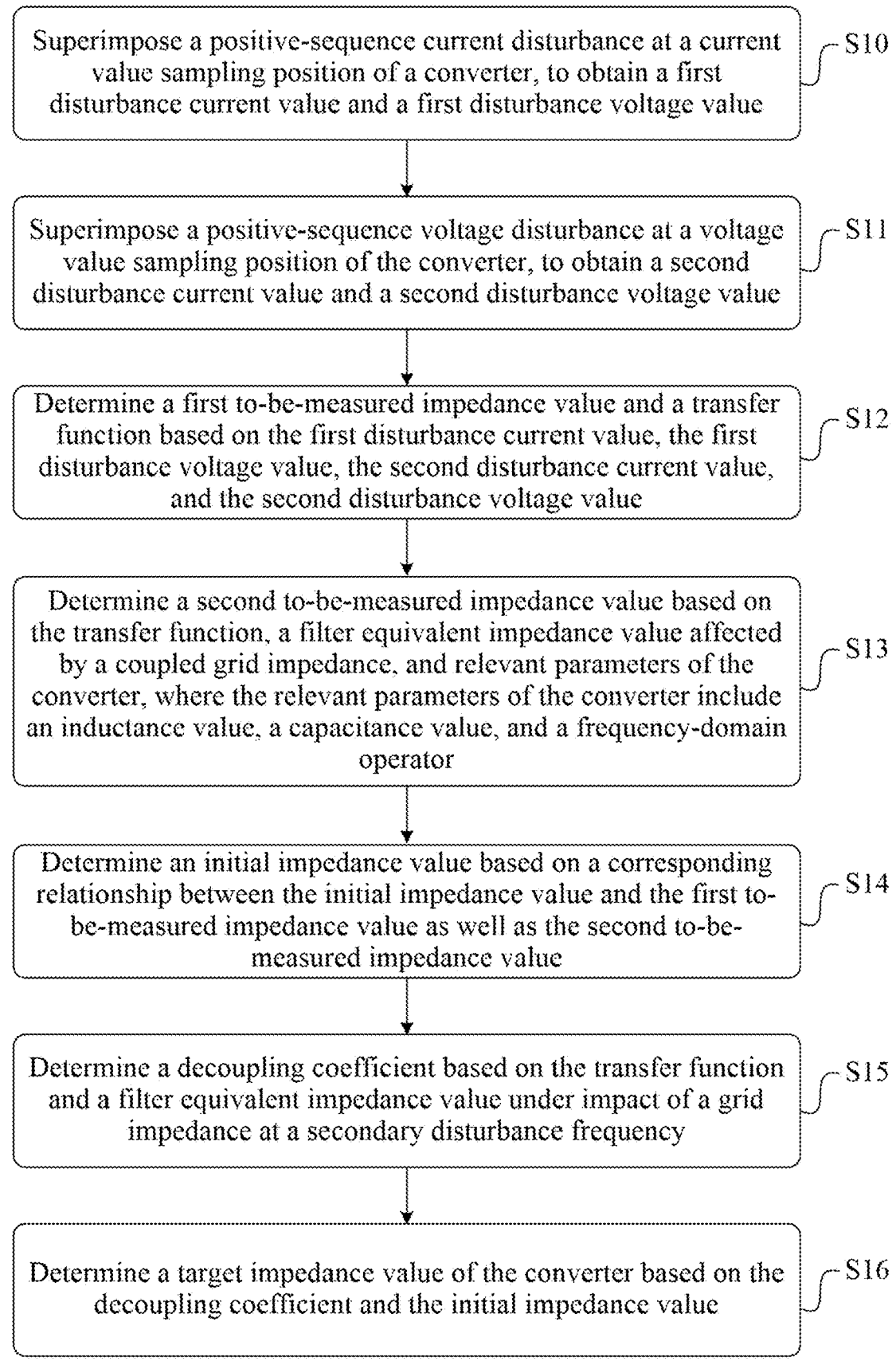
FIG. 2 is a flowchart of an impedance measurement method for a converter according to an embodiment of the present application.

In order to resolve the above technical problem, the present application provides an impedance measurement method for a converter. As shown in FIG. 2, the method includes the following steps:

S10: A positive-sequence current disturbance is superimposed at a current value sampling position of the converter, to obtain a first disturbance current value and a first disturbance voltage value.

S11: A positive-sequence voltage disturbance is superimposed at a voltage value sampling position of the converter, to obtain a second disturbance current value and a second disturbance voltage value.

Figure 3:
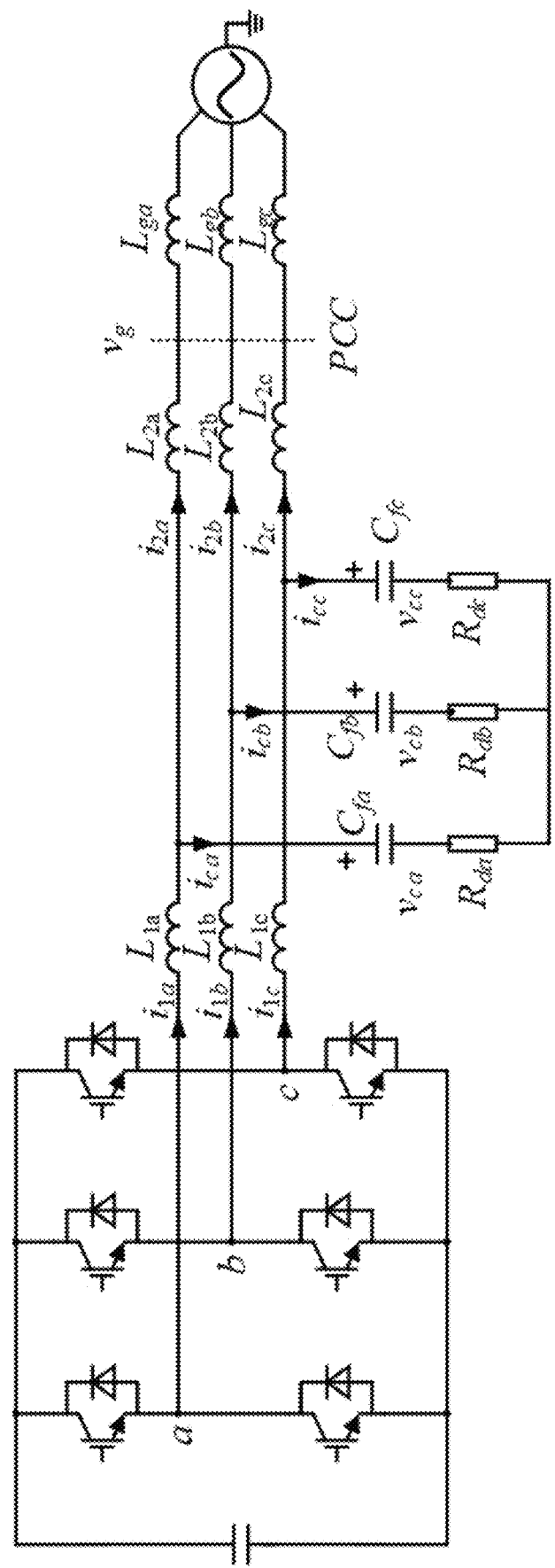
FIG. 3 is a main circuit topology diagram of a converter according to an embodiment of the present application.
Figure 4:
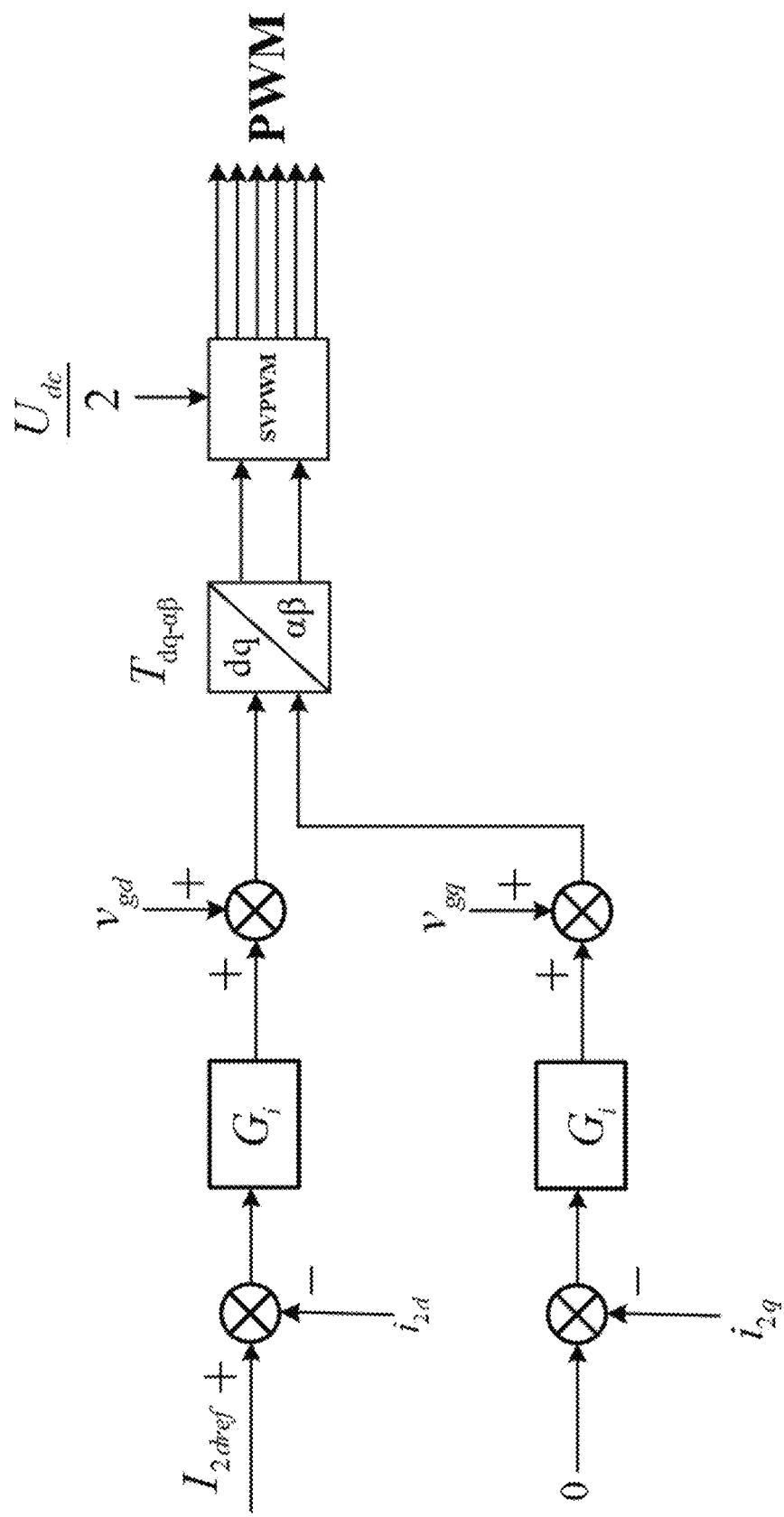
FIG. 4 is a block diagram of grid-side output current closed-loop control of a converter according to an embodiment of the present application.

In a specific embodiment, a main circuit topology diagram of the converter is shown in FIG. 3. The circuit topology diagram shown in FIG. 3 is a three-phase circuit topology diagram. a, b, and c are three-phase of currents and voltages; $L_{1a}$, $L_{1b}$, $L_{1c}$, $L_{2a}$, $L_{2b}$, $L_{2c}$, $L_{ga}$, $L_{gb}$, and $L_{gc}$ are inductors (where $L_{1a}$, $L_{1b}$, and $L_{1c}$ have the same inductance value of $L_1$; $L_{2a}$, $L_{2b}$, and $L_{2c}$ have the same inductance value of $L_2$; $L_{ga}$, $L_{gb}$, and $L_{gc}$ have the same inductance value of $L_g$); $C_{fa}$, $C_{fb}$, and $C_{fc}$ are capacitors (where $C_{fa}$, $C_{fb}$, and $C_{fc}$ have the same capacitance value of $C_f$); $i_{1a}$, $i_{1b}$, $i_{1c}$, $i_{2a}$, $i_{2b}$, $i_{2c}$, $i_{ca}$, $i_{cb}$, and $i_{cc}$ are currents; $v_{ca}$, $v_{cb}$, and $v_{cc}$ are capacitor voltages; $R_{da}$, $R_{db}$, and $R_{dc}$ are resistors (where $R_{da}$, $R_{db}$, and $R_{dc}$ have the same resistance value of $R_d$). A corresponding block diagram of grid-side output current closed-loop control in this process is shown in FIG. 4. A current $I_{2ref}$ on a d-axis coordinate system and a reference current $i_{2d}$ on the d-axis coordinate system are combined through a current loop $G_i$ in a controller with a voltage $v_{gd}$ at a point of common coupling (PCC) in FIG. 3 on the d-axis coordinate system, and a current 0 on a q-axis coordinate system and a reference current $i_{2q}$ on the q-axis coordinate system are combined through a current loop parameter $G_i$ in the controller with a voltage $v_{gq}$ at the PCC in FIG. 3 on the q-axis coordinate system. Results of the two combinations are then transformed from the dq-coordinate system to the αβ-coordinate system. Based on the voltage of $$\frac{U_{dc}}{2}$$

Figure 5:
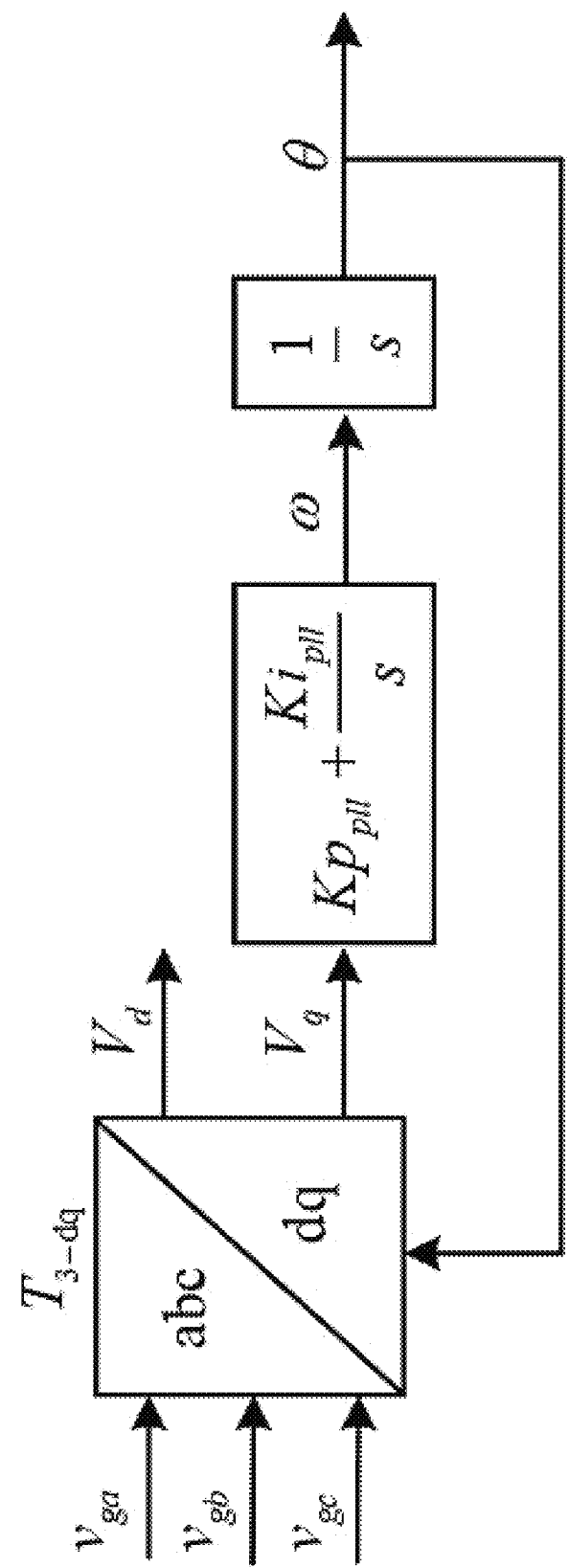
FIG. 5 is a block diagram of phase-locked loop control in a converter according to an embodiment of the present application.

($U_{dc}$ is a supply voltage), space vector pulse width modulation (SVPWM) conversion is performed to generate a required trigger pulse. A block diagram of phase-locked loop control in this process is shown in FIG. 5. Voltages $v_{ga}$, $v_{gb}$, and $v_{gc}$ at the PCC in FIG. 3 in an abc coordinate system are transformed from the abc-coordinate system to the dq-coordinate system to obtain voltages $V_d$ and $V_q$. The voltage $V_q$ then enters a proportional integral derivative (PID) control system for initial calculation (that is, $$Kp_{pll} + \frac{Ki_{pll}}{s},$$

where $Kp_{pll}$ and $$\frac{Ki_{pll}}{s}$$

are parameters of a phase-locked loop controller). Subsequently, an angular velocity ω, an operator $$\frac{1}{s},$$

and a phase angle θ are used for calculation, to obtain a final result. On this basis, a theoretical model of the positive-sequence impedance on the AC side of the converter is as follows:

$$Z_p(s) = \frac{sL_1 + sL_2 + \frac{L_1 L_2 C_f s^3}{C_f R_d s + 1} + K_{PWM} G_i(s - j2\pi f_1) G_{id}}{1 + \frac{L_1 C_f s^3}{C_f R_d s + 1} - }$$

$$K_{PWM} G_i(s - j2\pi f_1) T_p(s) I_1 e^{j\varphi_{i1}} - MT_p(sS) - K_{PWM} K_f G_{vd};$$

where $$M = V_1 \times \left(1 + \frac{L_1 C_f s^2}{C_f R_d s + 1}\right) + I_1 e^{j\varphi_{i1}} \times \left(sL_1 + sL_2 + \frac{L_1 L_2 C_f s^3}{C_f R_d s + 1}\right)$$

in the equation, M is an intermediate variable, $V_1$ is a voltage amplitude, $Z_p(s)$ is an impedance value (model), s is a frequency-domain operator, $L_1$ and $L_2$ are inductance values, $C_f$ is a capacitance value, $R_d$ is a resistance parameter, $K_{PWM}$ is a voltage gain of the converter, $G_i$ is a current loop coefficient in the controller, $f_1$ is a grid frequency (50 Hz), $T_p(s)$ is a phase-locked loop function, $I_1$ is a current amplitude, $e^{j\varphi_{i1}}$ is an angle vector, $K_f$ is a voltage feedforward coefficient, $G_{id}$ is a sampling delay value of an output current, and $G_{vd}$ is a sampling delay value of a voltage at the PCC.

It can be seen that, on the basis of knowing the complete structure and relevant parameters of the converter, the impedance value of the converter can be obtained using the above formula, while in practical applications, the manufacturers do not fully disclose the structure of the converter. Therefore, the above formula is not feasible in practical applications. However, the primary function of the converter is known in practical applications. That is, regardless of the type of converter, the main circuit topology diagram is essentially the same, as shown in the main circuit topology diagram in FIG. 3.

On this basis, a current value sampling point and a voltage value sampling point of the converter are determined, the positive-sequence current disturbance is superimposed at the current value sampling position of the converter, to obtain the first disturbance current value and the first disturbance voltage value, and the positive-sequence voltage disturbance is superimposed at the voltage value sampling position of the converter, to obtain the second disturbance current value and the second disturbance voltage. Injection of the current disturbance causes the controller of the converter to generate a disturbance, which in turn outputs a disturbance current (that is, a first disturbance current). The first disturbance current value consists of two parts: one part is a first disturbance current generated by the current loop output in response to injection of the current disturbance, while the other part is due to the presence of line impedance and grid equivalent impedance, which causes the output disturbance current to excite a disturbance voltage at a same frequency at a PCC. The disturbance voltage then causes a phase-locked loop and a feedforward circuit of the converter to use the voltage at the PCC as input to control respective loop circuits, generating disturbances and outputting the other part of the first disturbance current value. The two parts of the first disturbance current value are then summed to obtain the final first disturbance current. Further, the corresponding first disturbance current value is determined based on the final first disturbance current. The first disturbance current value and the first disturbance voltage value can be directly obtained through measurement. Similarly, injection of the voltage disturbance excites the controller of the converter to generate a disturbance, outputting the disturbance current. However, unlike the situation of current disturbance, the disturbance current resulting from the voltage disturbance only has one part, that is, the disturbance voltage causes the phase-locked loop and the feedforward current of the converter to use the voltage at the PCC as input to control respective loop circuits, generating disturbances and outputting the second disturbance current. Further, the corresponding second disturbance current value is determined based on the second disturbance current. The second disturbance current value and the second disturbance voltage can be directly obtained through measurement.

The injected voltage or current disturbance may be a pulse wave signal, a random binary sequence, various wide-frequency signals, or the like. This is not limited in the present application.

S12: A first to-be-measured impedance value and a transfer function are determined based on the first disturbance current value, the first disturbance voltage value, the second disturbance current value, and the second disturbance voltage value.

S13: A second to-be-measured impedance value is determined based on the transfer function, a filter equivalent impedance value affected by a coupled grid impedance, and relevant parameters of the converter, where the relevant parameters of the converter include an inductance value, a capacitance value, and a frequency-domain operator.

S14: An initial impedance value is determined based on a corresponding relationship between the initial impedance value and the first to-be-measured impedance value as well as the second to-be-measured impedance value.

In the embodiments of the present application, the first disturbance current value, the first disturbance voltage value, the second disturbance current value, and the second disturbance voltage value, which have known specific values, are determined using measurement methods in the above steps. However, determining of the first disturbance current value and the second disturbance current value also follows a specific formula corresponding relationship. Under this corresponding relationship, the first to-be-measured impedance value and the transfer function can be preliminarily determined. Then, the second to-be-measured impedance value can be determined based on the transfer function, the filter equivalent impedance value affected by the coupled grid impedance, and the relevant parameters of the converter. Finally, the initial impedance value is determined based on the relationship between the initial impedance value and the first to-be-measured impedance value as well as the second to-be-measured impedance value. In simple terms, this means that in a specific corresponding relationship, there are inputs and outputs. Based on the known inputs, the corresponding outputs can be obtained. Similarly, based on the known outputs, the inputs can be deduced. In this step, the first disturbance current value, the first disturbance voltage value, the second disturbance current value, and the second disturbance voltage value are outputs of a first corresponding relationship, and the transfer function and the first to-be-measured impedance value are inputs of the first corresponding relationship. The transfer function, the filter equivalent impedance value affected by the coupled grid impedance, and the relevant parameters of the converter are inputs of a second corresponding relationship, and the second to-be-measured impedance value is an output of the second corresponding relationship. The first to-be-measured impedance value and the second to-be-measured impedance value are inputs of a third corresponding relationship, and the initial impedance value finally obtained is an output of the third corresponding relationship.

One point that needs to be clarified is the origin of the first to-be-measured impedance value and the second to-be-measured impedance value: first, the above-mentioned theoretical model of the positive-sequence impedance at the AC side of the converter is rewritten, and the rewritten theoretical model of the impedance is as follows:

$$Z_1(s) = \frac{sL_1 + sL_2 + \frac{L_1 L_2 C_f s^3}{C_f R_d s + 1} + K_{PWM} G_i(s - j2\pi f_1) G_{id}}{K_{PWM} G_i(s - j2\pi f_1) T_p(s) I_1 e^{j\varphi_{i1}} - MT_p(sS) - K_{PWM} K_f G_{vd}};$$

$$Z_0(s) = \frac{sL_1 + sL_2 + \frac{L_1 L_2 C_f s^3}{C_f R_d s + 1} + K_{PWM} G_i(s - j2\pi f_1) G_{id}}{1 + \frac{L_1 C_f s^3}{C_f R_d s + 1}};$$

and $$\frac{1}{Z_p(s)} = \frac{1}{Z_0(s)} + \frac{1}{-Z_1(s)}.$$

In other words, the present application splits the original theoretical model of the positive-sequence impedance at the AC side into two components, and $Z_p(s)$ is separated into $Z_1(s)$ and $Z_0(s)$. Based on this splitting principle and the aforementioned corresponding relationships, the first to-be-measured impedance value, the transfer function, and the second to-be-measured impedance value are determined based on the first disturbance current value, the first disturbance voltage value, the second disturbance current value, the second disturbance voltage, the filter equivalent impedance value affected by the grid impedance, and the relevant parameters of the converter. Finally, the initial impedance value is obtained.

S15: A decoupling coefficient is determined based on the transfer function and a filter equivalent impedance value under impact of a grid impedance at a secondary disturbance frequency.

S16: A target impedance value of the converter is determined based on the decoupling coefficient and the initial impedance value.

In the embodiments of the present application, when the current disturbance and the voltage disturbance are injected and the impedance value of the converter is measured, the grid impedance in the circuit is actually connected in series with a grid-side inductance of the filter, which changes the original impedance of the filter. Therefore, when calculating the final target impedance value, it is necessary to eliminate the impact of the line impedance and grid impedance during measurement. That is, at the secondary disturbance frequency (the current disturbance and the voltage disturbance), the decoupling coefficient is determined based on the obtained grid line impedance and the transfer function determined in the previous step. The decoupling coefficient represents the impact of the line impedance and the grid impedance during measurement. Finally, the target impedance value of the converter is determined based on the decoupling coefficient and the initial impedance value.

The impedance measurement method for a converter provided in the present application includes: superimposing a positive-sequence current disturbance at a current value sampling position of the converter, to obtain a first disturbance current value and a first disturbance voltage value; superimposing a positive-sequence voltage disturbance at a voltage value sampling position of the converter, to obtain a second disturbance current value and a second disturbance voltage value; determining a first to-be-measured impedance value and a transfer function based on the first disturbance current value, the first disturbance voltage value, the second disturbance current value, and the second disturbance voltage value; determining a second to-be-measured impedance value based on the transfer function, a filter equivalent impedance value affected by a coupled grid impedance, and relevant parameters of the converter, where the relevant parameters of the converter include an inductance value, a capacitance value, and a frequency-domain operator; determining an initial impedance value based on the first to-be-measured impedance value and the second to-be-measured impedance value; determining a decoupling coefficient based on the transfer function and a filter equivalent impedance value under impact of a grid impedance at a secondary disturbance frequency; and determining a target impedance value of the converter based on the decoupling coefficient and the initial impedance value. As can be seen, the present application injects virtual secondary-side disturbances at the voltage and current sampling points of the converter, specifically by superimposing the positive-sequence current disturbance and the positive-sequence voltage disturbance. During operation, there is no need to add actual disturbance sources or modify the primary-side circuit components. Overall, this results in low engineering costs and simple practical operation. In addition, calculation of the target impedance value in the present application does not require the converter manufacturers to disclose the parameters or structure of the controller, thereby expanding the application scope of the present application. Furthermore, during calculation of the target impedance value, the present application takes into account the impact of the grid impedance value and the line impedance. Before obtaining the final target impedance value, decoupling is performed to remove the impact of the grid equivalent impedance, thereby obtaining the true and accurate impedance value of the converter.

Based on the above embodiments, in a preferred embodiment, an expression of the first disturbance current value is:

$$i_{g1} = \frac{v_{p1}}{Z'_1(s)} + \Delta i_t \times G_c;$$

where $i_{g1}$ is the first disturbance current value, $v_{p1}$ is the first disturbance voltage value generated by superimposing the positive-sequence current disturbance at the current value sampling position of the converter, $Z'_1(s)$ is the first to-be-measured impedance value, $\Delta i_t$ is a virtual injected disturbance current corresponding to the positive-sequence current disturbance superimposed at the current value sampling position of the converter, and $G_c$ is the transfer function.

In a preferred embodiment, an expression of the second disturbance current value is:

$$i_{g2} = \frac{v_{p2} + \Delta v_t}{Z'_1(s)};$$

where $i_{g2}$ is the second disturbance current value, $v_{p2}$ is the second disturbance voltage value generated by superimposing the positive-sequence voltage disturbance at the voltage value sampling position of the converter, $Z'_1(s)$ is the first to-be-measured impedance value, and $\Delta v_t$ is a virtual disturbance voltage corresponding to the positive-sequence voltage disturbance superimposed at the voltage value sampling position of the converter.

In a preferred embodiment, an expression of the second to-be-measured impedance value is:

$$Z'_0(s) = \frac{Z'_{filter}}{(1+G_c)\left(1 + \frac{L_1 C_f s^2}{C_f R_d s + 1}\right)};$$

where $Z'_0(s)$ is the second to-be-measured impedance value, $Z'_{filter}$ is the filter equivalent impedance value affected by the coupled grid impedance, $G_c$ is the transfer function, $L_1$ is the inductance value, $C_f$ is the capacitance value, and s is the frequency-domain operator.

In a preferred embodiment, an expression of the initial impedance value is:

$$\frac{1}{Z'_p(s)} = \frac{1}{Z'_0(s)} + \frac{1}{Z'_1(s)};$$

where $Z'_1(s)$ is the first to-be-measured impedance value, $Z'_0(s)$ is the second to-be-measured impedance value, and $Z'_p(s)$ is the initial impedance value.

In a specific embodiment, the impedance values $Z_1(s)$ and $Z_0(s)$ are obtained by rewriting the theoretical model of the positive-sequence impedance at the AC side of the converter. By substituting specific values from the present application into the rewritten impedance formula, the first to-be-measured impedance value $Z'_1(s)$ and the second to-be-measured impedance value $Z'_0(s)$ in the present application can be obtained.

The specific step is determining the first to-be-measured impedance value and the transfer function based on the first disturbance current value, the first disturbance voltage value, the second disturbance current value, and the second disturbance voltage value. In other words, when the first disturbance current value and the second disturbance current value are as shown above, the expression of the first to-be-measured impedance value is as follows:

$$Z'_1(s) = \frac{v_{p2} + \Delta v_t}{i_{g2}};$$

an expression of the transfer function is as follows:

$$G_c = \frac{i_{g1} \times (v_{p2} + \Delta v_t) - i_{g2} \times v_{p1}}{(v_{p2} + \Delta v_t) \times \Delta i_t};$$

where the filter equivalent impedance value $Z'_{filter}$ affected by the coupled grid impedance in the expression of the second to-be-measured impedance value is specifically as follows:

$$Z'_{filter} = sL_1 + sL'_2 + \frac{L_1 L'_2 C_f s^3}{C_f R_d s + 1}\bigg|_{L'_2 = L_2 + L_g};$$

where $L'_2$ is the equivalent resistance value. Based on $i_{g1}$ (measured and known), $v_{p1}$ (measured and known), $\Delta i_t$ (the injected disturbance known), $i_{g2}$ (measured and known), $v_{p2}$ (measured and known), $\Delta v_t$ (the injected disturbance known), s (known), $L_1$ (known), $L_2$ (known), $L_g$ (known), $C_f$ (known), $R_d$ (known), $Z'_{filter}$, $Z'_1(s)$, and Ge can be known. Further, the initial impedance value $Z'_p(s)$ can be obtained.

It should be noted that the present application presents merely one possible implementation, and is not limited to this implementation. The implementation can be adjusted according to user needs.

The present application provides a specific process for obtaining the initial impedance value, as well as the calculation formula required in the process. According to the formula, the voltage and current in the circuit are measured, the relevant parameters (filter parameters) of the converter are obtained from the component nameplate, while the control parameters of the converter do not need to be known. This approach broadens the application scope of the present application while ensuring the accuracy of the obtained initial impedance value.

Based on the above embodiments, in a preferred embodiment, the decoupling coefficient is determined based on the transfer function and the filter equivalent impedance value affected by the grid impedance at the secondary disturbance frequency, where an expression of the decoupling coefficient is:

$$K' = \frac{Z_{filter} - \frac{G_c}{1+G_c}Z'_{filter}}{Z'_{filter} - \frac{G_c}{1+G_c}Z'_{filter}};$$

where K' is the decoupling coefficient, $Z'_{filter}$ is the filter equivalent impedance value affected by the coupled grid impedance, $Z_{filter}$ is a filter equivalent impedance value not affected by the coupled grid impedance, and $G_c$ is the transfer function; and $Z_{filter}$ is the filter equivalent impedance values and $Z'_{filter}$ is the filter equivalent impedance values with impact of the grid impedance at the secondary disturbance frequency; and the target impedance value of the converter is determined based on the decoupling coefficient and the initial impedance value, where an expression of the target impedance value is:

$$Z_p(s)=K'Z'_p(s);$$

where $Z'_p(s)$ is the initial impedance value, and $Z_p(s)$ is the target impedance value.

In a specific embodiment, when the current disturbance and the voltage disturbance are injected and the impedance value of the converter is measured, the grid impedance in the circuit is actually connected in series with the a grid-side inductance of the filter, which changes the original impedance of the filter. Therefore, when calculating the final target impedance value, it is necessary to eliminate the impact of the line impedance and grid impedance during measurement. That is, at the secondary disturbance frequency (the current disturbance and the voltage disturbance), the grid line impedance and the transfer function determined in the previous step are obtained to determine the decoupling coefficient. The decoupling coefficient represents the impact of the line impedance and the grid impedance during measurement. Finally, the target impedance value of the converter is determined based on the decoupling coefficient and the initial impedance value.

The determining principle of the expression of the decoupling coefficient and the expression of the target impedance value is as follows:

A complete calculation formula of the target impedance value is as follows:

$$Z_p(s) = \frac{Z_{filter} + K_{PWM}G_i(s - j2\pi f_1)G_{id}}{Z'_{filter} + K_{PWM}G_i(s - j2\pi f_1)G_{id}} Z'_p(s);$$

where $$K_{PWM}G_i(s - j2\pi f_1)G_{id} = -\frac{G_c}{1+G_c}Z'_{filter};$$

$$Z'_{filter} = sL_1 + sL'_2 + \frac{L_1 L'_2 C_f s^3}{C_f R_d s + 1}\bigg|_{L'_2=L_2+L_g};$$

$$Z_{filter} = sL_1 + sL_2 + \frac{L_1 L_2 C_f s^3}{C_f R_d s + 1};$$

therefore, $$K' = \frac{Z_{filter} - \frac{G_c}{1+G_c}Z'_{filter}}{Z'_{filter} - \frac{G_c}{1+G_c}Z'_{filter}};$$

further, $$Z_p(s)=K'Z'_p(s);$$

as can be seen, the present application injects virtual secondary-side disturbances at the voltage and current sampling points of the converter, specifically by superimposing the positive-sequence current disturbance and the positive-sequence voltage disturbance. During operation, there is no need to add actual disturbance sources or modify the primary-side circuit components. Overall, this results in low engineering costs and simple practical operation. In addition, calculation of the target impedance value in the present application does not require the converter manufacturers to disclose the parameters or structure of the controller, thereby expanding the application scope of the present application. Furthermore, during calculation of the target impedance value, the present application takes into account the impact of the grid impedance value and the line impedance value. Before obtaining the final target impedance value, decoupling is performed to remove the impact of the grid equivalent impedance, thereby obtaining the true and accurate impedance value of the converter.

Figure 6:
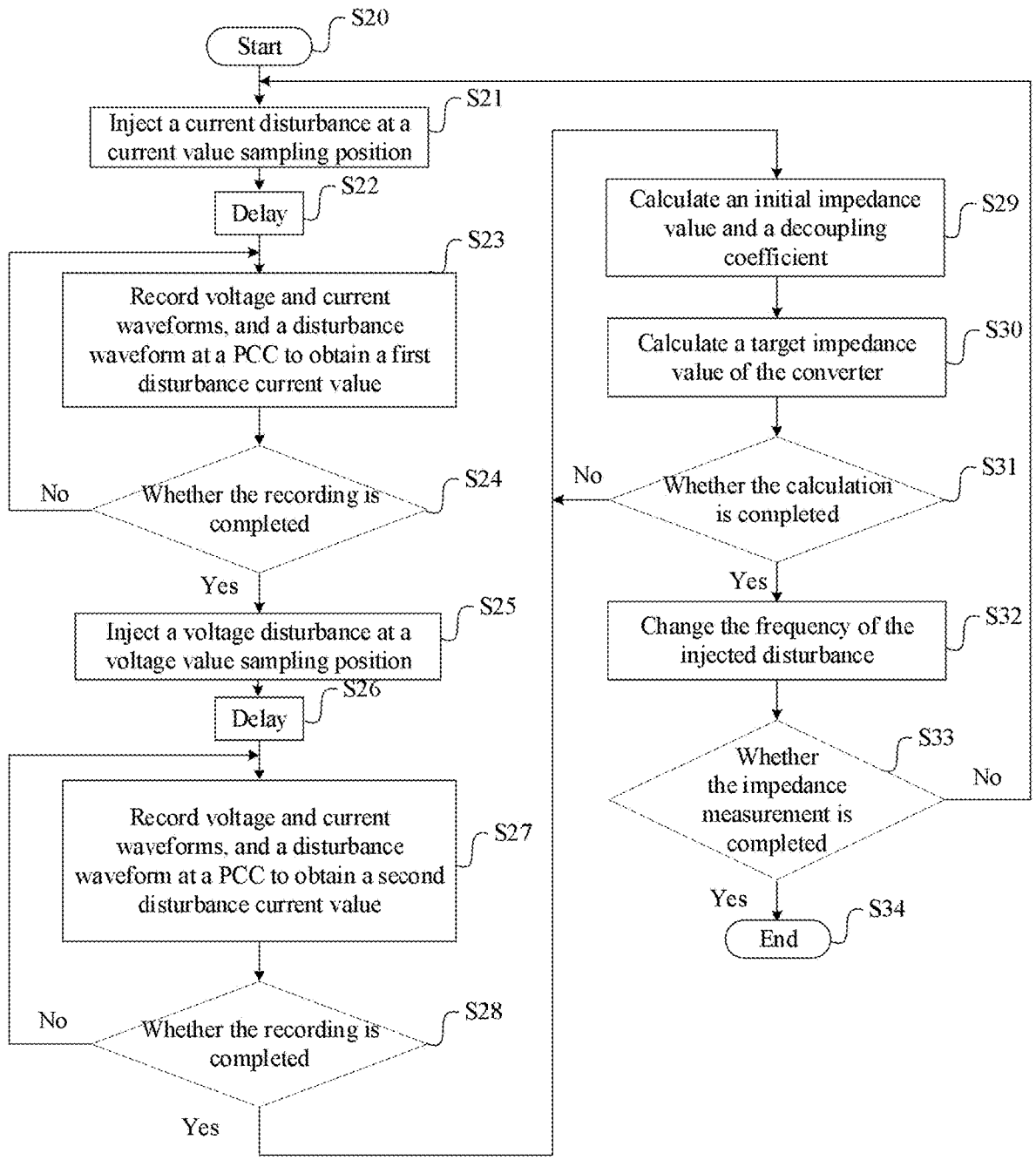
FIG. 6 is a complete flowchart of an impedance measurement method for a converter according to an embodiment of the present application.

Based on the above embodiments, it can be known that a complete flowchart of the impedance measurement method for a converter is shown in FIG. 6, including the following steps:

S20: The process starts.

S21: First, a current disturbance is injected.

S22: A delay occurs.

S23: Voltage and current waveforms, and a disturbance waveform at a PCC are recorded to obtain a first disturbance current value.

S24: Whether the recording is completed is determined; and if not, the process returns to the step S23; or if yes, the process proceeds to the step S25.

S25: Second, a voltage disturbance is injected.

S26: A delay occurs.

S27: Voltage and current waveforms, and a disturbance waveform at a PCC are recorded to obtain a second disturbance current value.

S28: Whether the recording is completed is determined; and if not, the process returns to the step S27; or if yes, the process proceeds to the step S29.

S29: An initial impedance value and a decoupling coefficient are calculated.

S30: A target impedance value of the converter is calculated.

S31: Whether the calculation is completed is determined; and if not, the process returns to the step S29.

S32: The frequency of the injected disturbance is changed.

S33: Whether the impedance measurement is completed is determined; and if not, the process proceeds to the step S21; or if yes, the process proceeds to the step S34.

S34: The process ends.

In the present application, the current disturbance is injected first by superimposing a single-frequency sine disturbance onto an actual current sampling value at a PCC of the converter. The second disturbance is a voltage disturbance, which is injected in the same manner as the first disturbance. After the injection of the secondary-side disturbances, a certain delay occurs, and then the voltage and current waveforms at the PCC of the converter, as well as the corresponding injected disturbance waveforms, are recorded. Through Fourier analysis, the disturbance components at the corresponding disturbance frequency are calculated and transformed into the positive and negative sequence coordinate system. The target impedance value of the converter at the to-be-measured frequency point is calculated using the formula mentioned above. This process includes two parts: calculating the initial impedance value and decoupling the initial impedance value to obtain the target impedance value. After one process is completed, the frequency of the injected sine disturbance is changed to the next to-be-measured frequency point, and the above steps are repeated.

Figure 7:
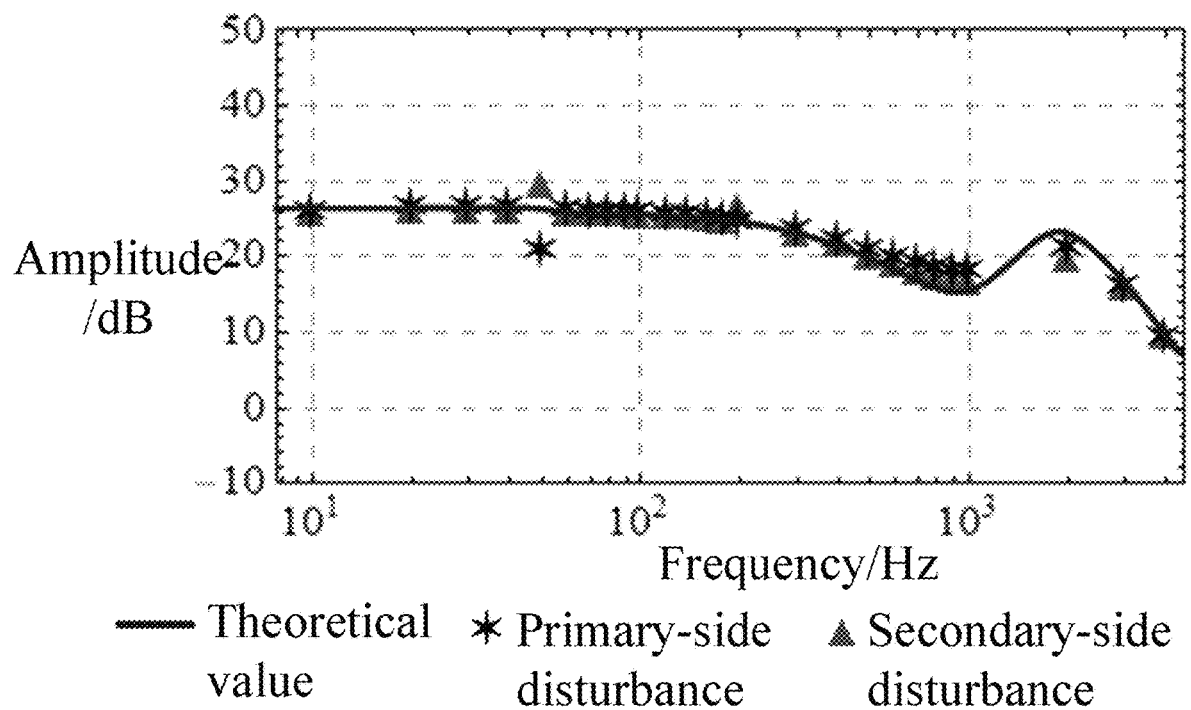
FIG. 7 is a first comparison diagram according to an embodiment of the present application.
Figure 8:
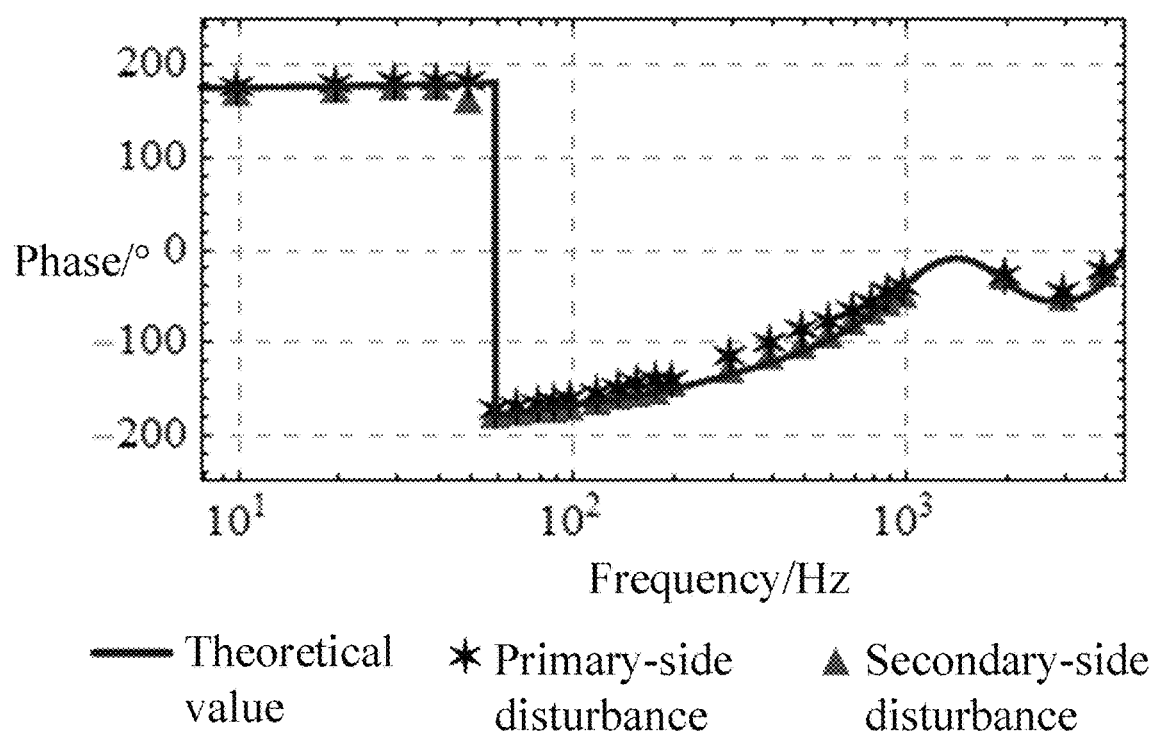
FIG. 8 is a second comparison diagram according to an embodiment of the present application.

When comparing the results of the present application with results obtained from the primary-side measurement method, the comparison results are shown in FIG. 7 and FIG. 8. As can be seen, the impedance results from the present application basically match the results from the primary-side measurement and the theoretical values, demonstrating the accuracy of the present application.

In summary, the method provided in the present application has the following beneficial effects:

1. Injection of virtual secondary-side disturbances at the voltage and current value sampling points of the PCC of the converter eliminates the need for additional disturbance power sources and does not require modifications to the primary-side circuit components. As a result, the present application has low engineering costs and is simple to implement in practice.

2. Injection of virtual secondary-side disturbances at the voltage and current value sampling points of the PCC of the converter does not require modifications to the original controller of the converter. Therefore, in actual impedance measurements, even if the converter manufacturers do not provide access to the controller, the present application can still be used to measure impedance values.

3. The present application considers the impact of the line and grid equivalent impedance and removes the impact of the grid equivalent impedance during calculation. As a result, the present application can measure the converter impedance value in both strong and weak grid conditions, and the measurement frequency range covers 10 Hz to 4 kHz.

In the above embodiments, a detailed description of the impedance measurement method for a converter is provided. The present application further provides an embodiment corresponding to an impedance measurement apparatus for a converter. It should be noted that the present application describes the embodiments of the apparatus from two perspectives: one from the functional module perspective and the other from the hardware perspective.

Figure 9:
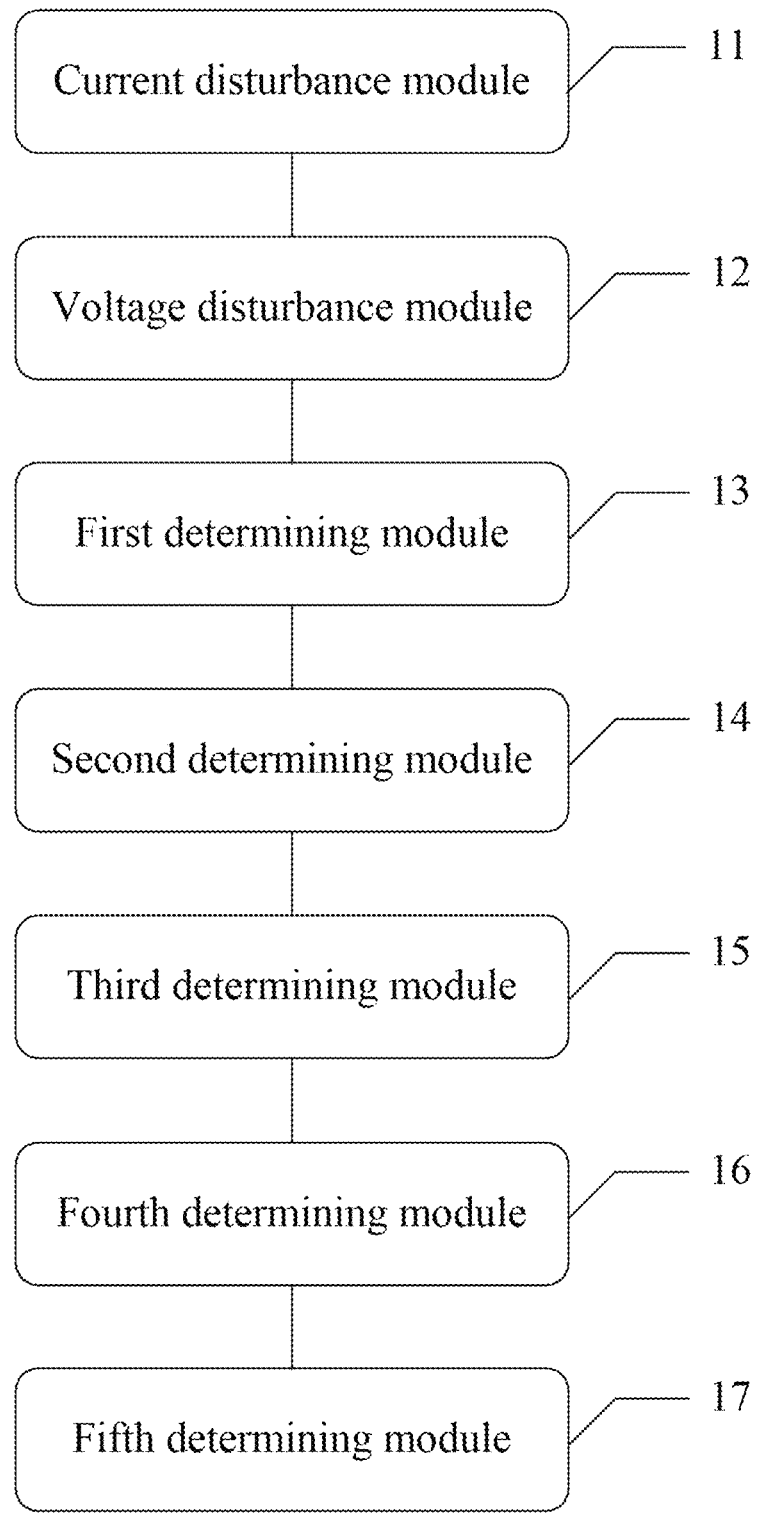
FIG. 9 shows an impedance measurement apparatus for a converter according to another embodiment of the present application.

FIG. 9 is a module diagram of an impedance measurement apparatus for a converter according to another embodiment of the present application, including:
  current disturbance module 11 configured to superimpose a positive-sequence current disturbance at a current value sampling position of the converter, to obtain a first disturbance current value and a first disturbance voltage value;
  voltage disturbance module 12 configured to superimpose a positive-sequence voltage disturbance at a voltage value sampling position of the converter, to obtain a second disturbance current value and a second disturbance voltage value;
  first determining module 13 configured to determine a first to-be-measured impedance value and a transfer function based on the first disturbance current value, the first disturbance voltage value, the second disturbance current value, and the second disturbance voltage value;
  second determining module 14 configured to determine a second to-be-measured impedance value based on the transfer function, a filter equivalent impedance value affected by a coupled grid impedance, and relevant parameters of the converter, where the relevant parameters of the converter include an inductance value, a capacitance value, and a frequency-domain operator;
  third determining module 15 configured to determine an initial impedance value based on the first to-be-measured impedance value and the second to-be-measured impedance value;
  fourth determining module 16 configured to determine a decoupling coefficient based on the transfer function and a filter equivalent impedance value under impact of a grid impedance at a secondary disturbance frequency; and
  fifth determining module 17 configured to determine a target impedance value of the converter based on the decoupling coefficient and the initial impedance value.

Since the embodiments of the apparatus correspond to the embodiments of the method, the embodiments of the apparatus are referred to the descriptions of the embodiments of the method. Details are not repeated herein.

Figure 10:
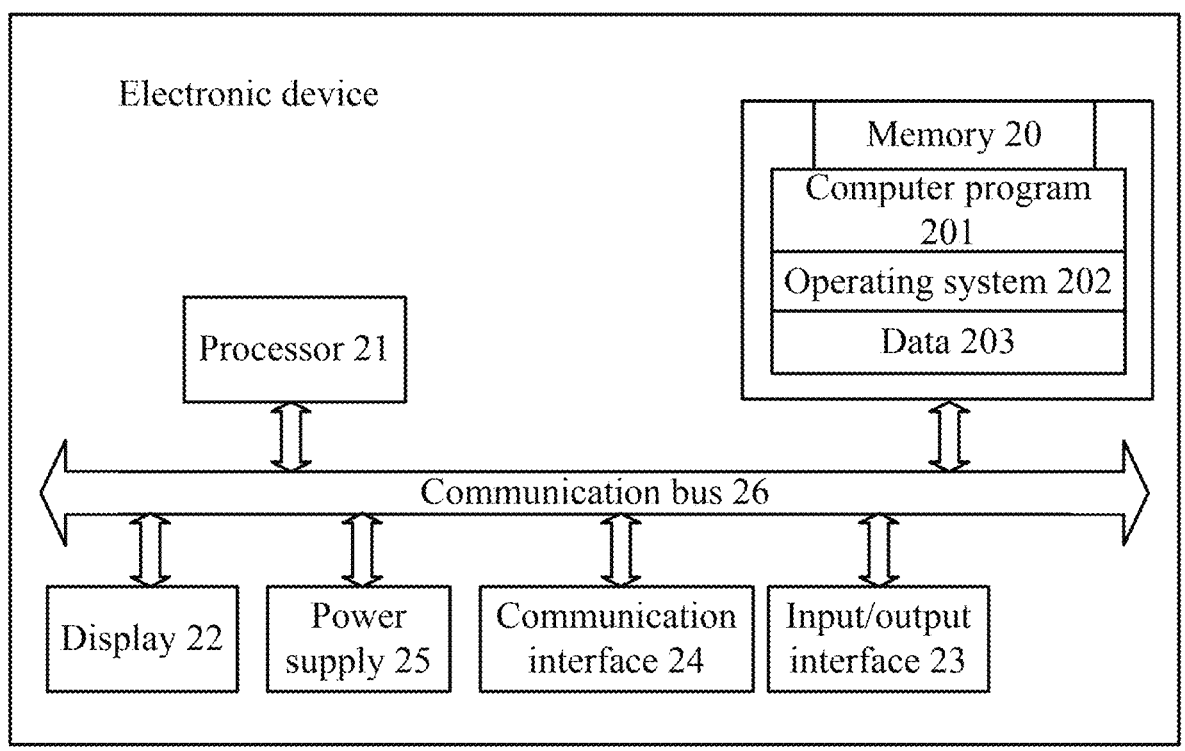
FIG. 10 is a structural diagram of an electronic device according to another embodiment of the present application.

FIG. 10 is a structural diagram of an electronic device according to another embodiment of the present application. As shown in FIG. 10, the electronic device includes:
memory 20 configured to store a computer program;
  processor 21 configured to execute the computer program to implement steps of the above impedance measurement method for a converter in the above embodiments.

The electronic device provided in the embodiments may be, but is not limited to, a smart phone, a tablet, a notebook, or a desktop computer.

The processor 21 may include one or more processing cores, for example, may be a 4-core processor or an 8-core processor. The processor 21 may be implemented by at least one hardware in a digital signal processor (DSP), a field-programmable gate array (FPGA), or a programmable logic array (PLA). The processor 21 may alternatively include a main processor and a coprocessor. The main processor is a processor configured to process data in an awake state, also referred to as a central processing unit (CPU); and the coprocessor is a low-power processor configured to process data in a standby state. In some embodiments, the processor 21 may be integrated with a graphics processing unit (GPU). The GPU is configured to be responsible for rendering and drawing content that a display needs to display. In some embodiments, the processor 21 may further include an artificial intelligence (AI) processor. The AI processor is configured to process computing operations related to machine learning.

The memory 20 may include one or more computer-readable storage media, which may be non-transitory. The memory 20 may further include a high-speed random access memory (RAM) and a non-volatile memory such as one or more magnetic disk storage devices and a flash storage device. In the embodiments, the memory 20 is configured to store at least following computer program 201. The computer program is loaded and executed by the processor 21 to implement the relative steps in the impedance measurement method for a converter according to any of the above embodiments. In addition, resources stored in the memory 20 may further include an operating system 202 and data 203. The storage method may be either temporary storage or permanent storage. The operating system 202 may include Windows, Unix, Linux, or the like.

In some embodiments, the electronic device may further include display 22, input/output interface 23, communication interface 24, power supply 25, and communication bus 26.

A person skilled in the art may understand that a structure shown in FIG. 10 does not constitute a limitation to the electronic device, and the electronic device may include more or fewer components than those shown in the figure.

The electronic device provided in the embodiments of the present application includes a memory and a processor. When executing a program stored in the memory, the processor implements the above the impedance measurement method for a converter, and provides the same beneficial effects.

Finally, the present application further provides an embodiment corresponding to a computer-readable storage medium. The computer-readable storage medium stores a computer program, and the steps of the foregoing method embodiments are implemented when the computer program is executed by a processor.

It can be understood that if implemented in a form of a software functional unit and sold or used as a standalone product, the method in the above embodiments may be stored in a computer-readable storage medium. Based on such an understanding, the technical solution of the present application essentially, or a part contributing to the prior art, or a part or all of the technical solution may be embodied in the form of a software product, the computer software product is stored in a storage medium to execute all or some steps of the method according to the embodiments of the present application. The foregoing storage medium includes any medium that can store program code, such as a USB flash drive, a removable hard disk, a read-only memory (ROM), a random access memory (RAM), a magnetic disk, or an optical disc.

The impedance measurement method and apparatus for a converter, the electronic device, and the medium provided in the present application are described in detail above. Each embodiment in the description is described in a progressive mode, each embodiment focuses on differences from other embodiments, and references can be made to each other for the same and similar parts between embodiments. Since the apparatus disclosed in the embodiments corresponds to the method disclosed in the embodiments, the description is relatively simple, and reference can be made to description of the method for relevant contents. It should be noted that several improvements and modifications may also be made by those of ordinary skill in the art without departing from the principles of the present application, which also fall within the scope of protection of the present application.

Finally, it should be further noted that, in this description, relationship terms such as first and second are only used to distinguish an entity or operation from another entity or operation, but do not necessarily require or imply that there is any actual relationship or order between these entities or operations. In addition, terms "include", "comprise", or their any other variations are intended to cover a non-exclusive inclusion, so that a process, a method, an article, or a device including a series of elements not only includes those elements, but also includes other elements that are not explicitly listed, or also includes inherent elements of the process, the method, the article, or the device. Without more restrictions, the elements defined by the sentence "including a . . . " do not exclude the existence of other identical elements in the process, method, article, or device including the elements.

What is claimed is:

1. An impedance measurement method for a converter, comprising:
  injecting into the converter a positive-sequence current disturbance by superimposing the positive-sequence current disturbance at a current value sampling position of the converter, and measuring a first disturbance current value and a first disturbance voltage value from the converter;
  injecting into the converter a positive-sequence voltage disturbance by superimposing the positive-sequence voltage disturbance at a voltage value sampling position of the converter, and measuring a second disturbance current value and a second disturbance voltage value from the converter;
  determining a first to-be-measured impedance value and a transfer function based on the first disturbance current value, the first disturbance voltage value, the second disturbance current value, and the second disturbance voltage value;
  determining a second to-be-measured impedance value based on the transfer function, a filter equivalent impedance value affected by a coupled grid impedance, and relevant parameters of the converter, wherein the relevant parameters of the converter comprise an inductance value, a capacitance value, and a frequency-domain operator;
  determining an initial impedance value based on the first to-be-measured impedance value and the second to-be-measured impedance value;
  determining a decoupling coefficient based on the transfer function and a filter equivalent impedance value under impact of a grid impedance at a secondary disturbance frequency; and
  determining and outputting a target impedance value of the converter based on the decoupling coefficient and the initial impedance value;
  wherein an expression of the first disturbance current value is:

$$i_{g1} = \frac{v_p1}{Z'_1(s)} + \Delta i_t \times G_c;$$

an expression of the second disturbance current value is:

$$i_{g2} = \frac{v_{p2} + \Delta v_t}{Z'_1(s)};$$

an expression of the first to-be-measured impedance value is:

$$Z'_1(s) = \frac{v_{p2} + \Delta v_t}{i_{g2}};$$

an expression of the transfer function is:

$$G_c = \frac{i_{g1} \times (v_{p2} + \Delta v_t) - i_{g2} \times v_{p1}}{(v_{p2} + \Delta v_t) \times \Delta i_t};$$

an expression of the second to-be-measured impedance value is:

$$Z'_0(s) = \frac{Z'_{filter}}{(1 + G_c)\left(1 + \frac{L_1 C_f s^2}{C_f R_d s + 1}\right)};$$

an expression of the initial impedance value is:

$$\frac{1}{Z'_p(s)} = \frac{1}{Z'_0(s)} + \frac{1}{-Z'_1(s)};$$

an expression of the decoupling coefficient is:

$$K' = \frac{Z_{filter} - \frac{G_c}{1+G_c}Z'_{filter}}{Z'_{filter} - \frac{G_c}{1+G_c}Z'_{filter}};$$

and
an expression of the target impedance value is:

$$Z_p(s) = K'Z'_p(s);$$

wherein $i_{g1}$ is the first disturbance current value, $v_{p1}$ is the first disturbance voltage value generated by superimposing the positive-sequence current disturbance at the current value sampling position of the converter, $Z'_1(s)$ is the first to-be-measured impedance value, $\Delta i_t$ is a virtual injected disturbance current corresponding to the positive-sequence current disturbance superimposed at the current value sampling position of the converter, and $G_c$ is the transfer function; $i_{g2}$ is the second disturbance current value, $v_{p2}$ is the second disturbance voltage value generated by superimposing the positive-sequence voltage disturbance at the voltage value sampling position of the converter, $\Delta v_t$ is a virtual disturbance voltage corresponding to the positive-sequence voltage disturbance superimposed at the voltage value sampling position of the converter, $Z'_0(s)$ is the second to-be-measured impedance value, $Z'_{filter}$ is the filter equivalent impedance value affected by the coupled grid impedance, $L_1$ is the inductance value, $C_f$ is the capacitance value, $R_d$ is a resistance parameter, s is the frequency-domain operator, $Z'_p(s)$ is the initial impedance value, K' is the decoupling coefficient, $Z_{filter}$ is a filter equivalent impedance value not affected by the coupled grid impedance, and $Z_p(s)$ is the target impedance value, wherein $Z'_{filter}$ is the filter equivalent impedance values with the impact of the grid impedance at the secondary disturbance frequency.

* * * * *